United States Patent
Lai

(10) Patent No.: US 6,825,612 B2
(45) Date of Patent: Nov. 30, 2004

(54) ORGANIC LIGHT EMITTING DIODE INCLUDING DITCHES IN A SUBSTRATE

(75) Inventor: Hsiao-Ping Lai, Miao-Li Hsien (TW)

(73) Assignee: AU Optronics Corp., Hsin-Chu (TW)

( * ) Notice: Subject to any disclaimer, the term of this patent is extended or adjusted under 35 U.S.C. 154(b) by 55 days.

(21) Appl. No.: 10/065,664

(22) Filed: Nov. 7, 2002

(65) Prior Publication Data

US 2004/0046494 A1 Mar. 11, 2004

(30) Foreign Application Priority Data

Sep. 5, 2002 (TW) ........................................ 91120384 A

(51) Int. Cl.⁷ .............................................. H05B 33/04
(52) U.S. Cl. ...................................... 313/512; 313/504
(58) Field of Search ................................. 313/498–512; 315/169.3; 428/690, 917; 445/24; 345/45, 76

(56) References Cited

U.S. PATENT DOCUMENTS

| | | | |
|---|---|---|---|
| 5,239,228 A | * | 8/1993 | Taniguchi et al. .......... 313/512 |
| 5,645,948 A | * | 7/1997 | Shi et al. ..................... 428/690 |
| 5,882,761 A | | 3/1999 | Kawami et al. |
| 5,909,081 A | * | 6/1999 | Eida et al. ................... 313/504 |
| 5,998,803 A | * | 12/1999 | Forrest et al. ................ 257/40 |
| 6,614,171 B2 | * | 9/2003 | Rajeswaran et al. ........ 313/500 |
| 6,639,246 B2 | * | 10/2003 | Honda .......................... 257/72 |
| 2002/0155320 A1 | * | 10/2002 | Park et al. .................. 428/690 |

FOREIGN PATENT DOCUMENTS

| | | |
|---|---|---|
| TW | 401631 | 8/1990 |
| TW | 481966 | 4/2002 |

* cited by examiner

Primary Examiner—Nimeshkumar D. Patel
Assistant Examiner—Karabi Guharay
(74) Attorney, Agent, or Firm—Winston Hsu

(57) ABSTRACT

An organic light emitting diode (OLED) includes a bottom substrate, a bottom electrode formed on the bottom substrate, an organic layer formed on a predetermined region of the bottom electrode, a top electrode formed on the organic layer, a top substrate, and a sealing material formed on a spot glue region of the bottom substrate to bind the top substrate and the bottom substrate together. The top substrate further includes at least one ditch formed within the top substrate, and the ditch is used to prevent the sealing material from overflowing into the predetermined region of the bottom electrode.

26 Claims, 3 Drawing Sheets

ORGANIC LIGHT EMITTING DIODE INCLUDING DITCHES IN A SUBSTRATE

BACKGROUND OF INVENTION

1. Field of the Invention

The present invention relates to an organic light emitting device, and more particularly, to an organic light emitting diode (OLED) that can prevent a sealing material from overflowing and affecting normal operation of the OLED.

2. Description of the Prior Art

In various types of flat panel displays, since an OLED has many beneficial characteristics, such as having a spontaneous light source, a wide viewing angle, high response velocity, full-color, simpler structure, and a wide operating temperature, and saving power, the OLED has been used extensively in small and medium scale portable display fields.

Please refer to FIG. 1, which is a cross-sectional view of a conventional OLED 10. As shown in FIG. 1, the conventional OLED 10 mainly includes a transparent glass substrate 12, a transparent conductive layer 14 positioned on the glass substrate 10, an organic layer 16 positioned on a predetermined region of the transparent conductive layer 14, and a metal layer 18 positioned on the organic layer 16. The transparent conductive layer 14 is used as an anode of the OLED 10, and the metal layer 18 is used as a cathode of the OLED 10.

In addition, the organic layer 16 further includes a hole transport layer (HTL) 20, an emitting layer (EML) 22, and an electron transport layer (ETL) 24 Positioned on the transparent conductive layer 14, respectively. Furthermore, a hole injection layer (HIL, not show in FIG. 1) can be positioned between the transparent conductive layer 14 and the HTL 20, and an electron injection layer (EIL, not shown in FIG. 1) can be formed between the metal layer 18 and the ETL 24, for improving an adhesion problem of the transparent conductive layer 14, the organic layer 16, and the metal layer 18, and benefiting electrons and holes being injected into the organic layer 16. Moreover, another emitting layer (not shown in FIG. 1) that has an ability of transporting the electrons, or another HTL (not shown in FIG. 1) that has an ability of irradiating light, can be chosen to simply structure of the OLED. Typically, the transparent conductive layer 14 is composed of indium tin oxide (ITO) or indium zinc oxide (IZO). The organic layer 16 is formed by utilizing a thermal evaporation process, the HTL 20 is composed of diamine chemical Compound, and the metal layer 18 is composed of magnesium (Mg), aluminum (Al), lithium (Li) or an alloy of Mg, Al, and Li.

When a direct current (DC) voltage is applied to the OLED 10, the electrons penetrate through the ETL 24 from the metal layer 18 (the cathode of the OLED 10), and the holes penetrate through the HTL 20 from the transparent conductive layer 14 (the anode of the OLED 10), and then the electrons and the holes are both injected into the emitting layer 22. Further, the electrons and the holes move and re-combine together to form an electron/hole pair in the emitting layer 22, and organic light emitting molecules of the emitting layer 22 are excited to an excitation state due to a potential difference caused by an external electric field. When the molecules discharge energy and return to a base sate, a fixed ratio of the discharging energy (i.e. the quantum efficiency, QE) is liberated in photon. Thereafter, the photon permeates the glass substrate 12 and illuminates downward. This is caused by electroluminescence of the OLED 10.

However, the organic layer 16 and the metal layer 18 of the OLED 10 are very sensitive to moisture and oxygen gas. As soon as the organic layer 16 and the metal layer 18 are in touch with moisture and oxygen gas, the organic layer 16 could peel off the transparent conductive layer 14 and the metal layer 18, the metal layer 18 could be oxidized, and dark spots could be generated in the OLED, reducing display quality, lowering glow of the OLED, and decreasing life of the OLED. Therefore, a passivation and encapsulation material of the OLED must have characteristics of perfect anti-abrasiveness, high thermal conductivity, and lower moisture permeability, to prevent the organic layer from contacting with the outside environment efficiently, and to increase the life of the OLED.

Please refer to FIG. 1 again, an encapsulation process of the conventional OLED 10 utilizes a sealing material 26, such as a binder composed of high polymer glue materials, to bind a container 28 made of glass or metal on the glass substrate 12. Then, dry nitrogen gas is injected into a hollow part between the container 28 and the glass substrate 12 to accomplish the encapsulation process of the OLED 10. In addition, a desiccating agent (not shown in FIG. 1) can be positioned in the OLED 10 for adsorbing moisture that permeates from outside into the OLED 10 caused by imperfect encapsulation of the OLED 10, and preventing the organic layer 16 of the OLED 10 from moistening.

The conventional container 28 provides good isolation with the OLED 10, moisture and oxygen gas. However, quantity of the sealing material 26 has to be properly measured during a lamination process of the encapsulation process. If an excess of the sealing material 26 is used for a better airtightness of the OLED 10, the sealing material 26 could overflow into an inside of the OLED, due to improper distribution of the sealing material or unbalanced pressure during the lamination process. Therefore, the excess sealing materials are in touch with the organic layer 16 and affect the normal operation of the OLED 10. Consequently, the conventional encapsulation process of the OLED always decreases the quality of the sealing material to prevent the above-mentioned problem. On the other hand, if an insufficient amount of sealing material 26 is used to bind the glass substrate 12 and the container 28, the container 28 would not be sealed up with the glass substrate 12 closely, moisture and oxygen gas easily permeate the OLED 10, and the container 28 is easily peeled off the glass substrate 12. In addition, in order to increase the adhesion of the container 28 and the glass substrate 12, a surface of the conventional container 28 that correspond to the glass substrate 12 can be sandblasted or etched to be a rough surface for raising adhesive area of the container 28 and the glass substrate 12. However, illumination quality of the OLED is affected, and the container 28 with a rough surface cannot be applied in a top emission OLED (TOLED) display.

SUMMARY OF INVENTION

It is therefore a primary objective of the claimed invention to provide an organic light emitting device to avoid the above-mentioned problems.

According to the preferred embodiment of the claimed invention, an organic light emitting diode (OLED) is introduced. The OLED comprises a bottom substrate including a bottom electrode positioned on an upper surface of the bottom substrate, an organic layer positioned on a predetermined region of the bottom electrode, a top electrode positioned on the organic layer, and a spot glue region positioned on the bottom substrate and outside the predetermined region of the bottom electrode, a top substrate positioned parallel with the bottom substrate, and a lower surface of the top substrate having at least one first ditch formed within the top substrate, and a sealing material positioned on the spot glue region of the bottom substrate for binding the top substrate and the bottom substrate together. The first ditch is used to prevent the sealing material from overflowing into the predetermined region of the bottom substrate and affecting normal operation of the OLED.

Since the OLED of the claimed invention has the ditches positioned within the top substrate of the OLED, an excess sealing material can flow into the ditches if an excess of the sealing material is utilized to bind the top substrate and the bottom substrate together. Therefore, the excess sealing material does not contact with the organic layer of the OLED and affect the normal operation of the OLED.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
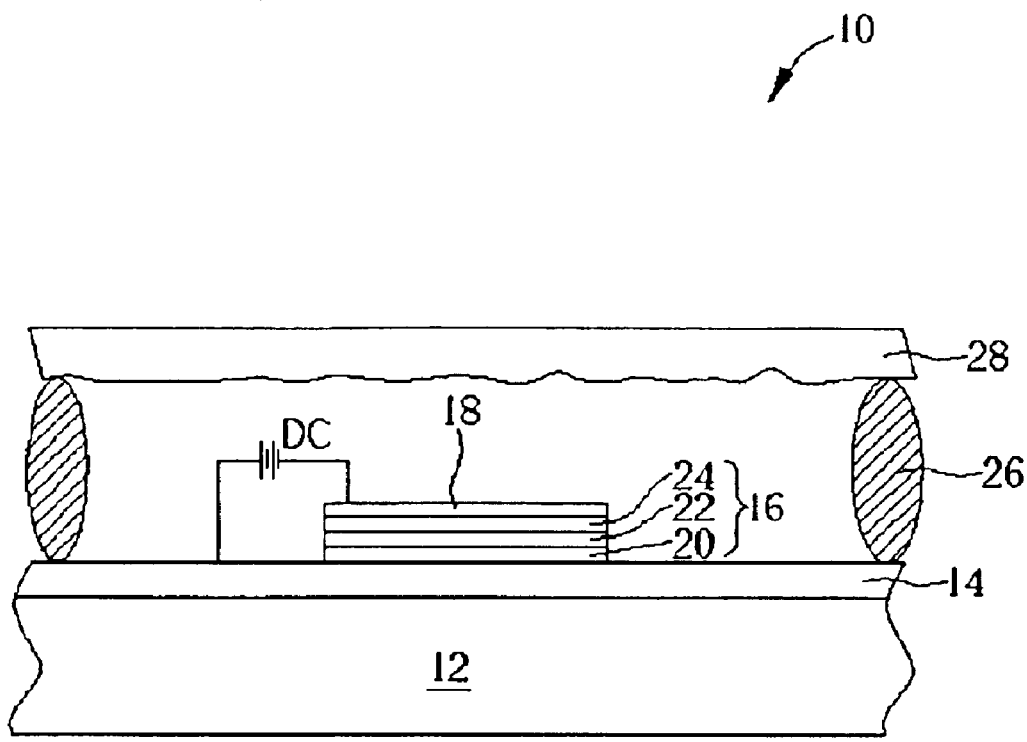
FIG. 1 is a cross-sectional view of a conventional OLED.
Figure 2:
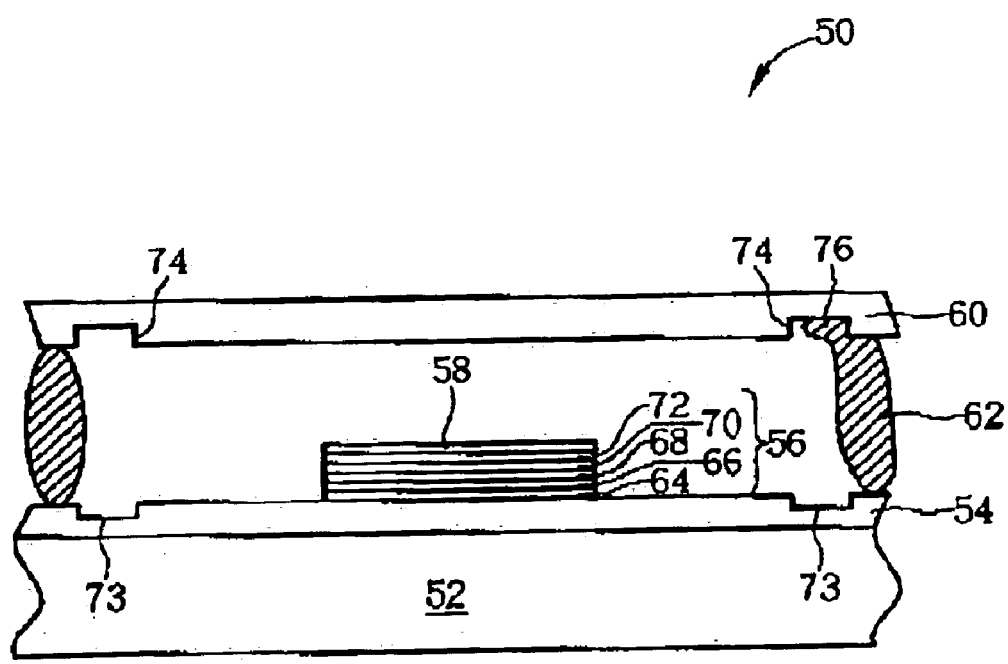
FIG. 2 is a cross-sectional view of an OLED according to the present invention.

Please refer to FIG. 2, which is a cross-sectional view of an OLED 50 according to the present invention. As shown in FIG. 2, the OLED 50 mainly includes a substrate 52, a transparent conductive layer 54 positioned on the substrate 52, an organic layer 56 positioned on a predetermined region of the transparent conductive layer 54 (i.e. on an active region of the OLED 50), a metal layer 58 positioned on the organic layer 56, and a substrate functioning as a passivation structure 60 of the OLED 50 positioned parallel with the substrate 52. The transparent conductive layer 54 is used as an anode or a bottom electrode of the OLED 50, and the metal layer 58 is used as a cathode or a top electrode of the OLED 50. Furthermore, a sealing material 62 positioned on a spot glue region outside the predetermined region of the substrate 52 is utilized to bind the passivation structure 60 and the substrate 52 together, and to prevent the organic layer 56 and the metal layer 58 from contacting with outside environment. Moreover, a desiccating agent (not shown in FIG. 2) can be positioned in the OLED 50 to prevent the organic layer 56 from moistening and the metal layer 58 from oxidizing.

In the preferred embodiment of the present invention, the substrate 52 can be a glass substrate, a plastic, or a metal substrate, and the transparent conductive layer 54 is composed of ITO or IZO. The organic layer 56 further includes a HIL 64, a HTL 66, an EML 68, an ETL 70, and an EIL 72 positioned on the transparent conductive layer 54, respectively. The metal layer 58 is composed of magnesium (Mg), aluminum (Al), lithium (Li) or an alloy of Mg, Al, and Li. The passivation structure 60 can be a glass substrate, a glass container or a metal container, and the sealing material 62 is composed of epoxy. As the prior art mentioned, the HIL 64 and the EIL 72 is a selectivity structure as demand of the OLED 50.

Additionally, the passivation structure 60 of the present invention has an annular ditch, i.e. two ditches 74 as shown in FIG. 2, positioned within the passivation structure 60 corresponding to substrate 52 and between the spot glue region and the predetermined region. If an excess of sealing material 62 is utilized on the spot glue region of the OLED 50 while performing the encapsulation process of the OLED 50, the excess sealing material 76 will flow into the ditches 74, and be not in touch with the organic layer 56 and affect normal operation of the OLED 50. In the preferred embodiment of the present invention, a cross-sectional view of each ditch 74 is substantially a rectangle, and a depth of each ditch 74 is less than half of a thickness of the passivation structure 60 to prevent from affecting mechanism strength of the passivation structure 60. However, the present invention is not limited in this, the cross-sectional view of each ditch 74 can be a polygon, U-shape, or can have various angles, to benefit the excess searing material 76 flowing into the ditches 74, and numbers of the ditches 74 can be adjusted according to the demand of the OLED 50. Moreover, ditches 73 similar to the ditches 74 can be positioned within the substrate 52 or the transparent conductive layer 54 between the spot glue region and the predetermined region, and the excess sealing material 76 can flow into the ditches 73 of the substrate 52 or the transparent conductive layer 54 to prevent the organic layer 56 from contacting with the excess sealing material 76. In addition, a depth of each ditch 73 of the substrate 52 or the transparent conductive layer 54 is less than half of a thickness of the substrate 52 or the transparent conductive layer 54.

Figure 3:
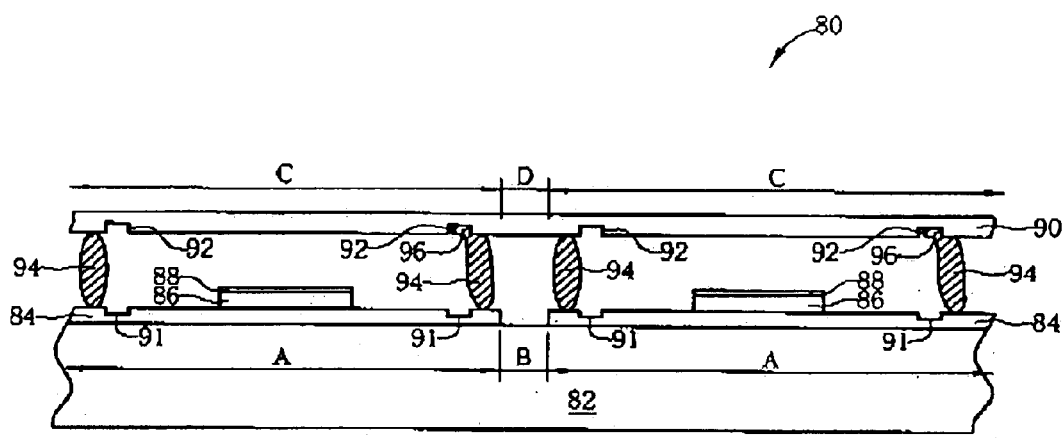
FIG. 3 is a cross-sectional view of an organic light emitting device according to the present invention.

Please refer to FIG. 3, which is a cross-sectional view of an organic light emitting device 80 according to the present invention. As shown in FIG. 3, the organic light emitting device 80 mainly includes a substrate 82, and the substrate 82 has at least two device regions A positioned on an upper surface of the substrate 82, and at least one segmented region B positioned between two adjacent device regions A. Each device region A is used to form an OLED, the segmented region B is used to isolate each OLED, and the segmented region B is a position for performing a cutting process to separate each OLED after completing the organic light emitting device 80.

Each device region A includes a conductive layer 84 positioned on the device region A, an organic layer 86 positioned on an active region of the device region A, and a metal layer 88 positioned on the organic layer 86. The conductive layer 84 is used as an anode of each OLED, and the metal layer 88 is used as a cathode of each OLED. In addition, the organic light emitting device 80 also includes a substrate functioning as a passivation structure 90 of the organic light emitting device 80 positioned parallel with the substrate 82. And that, a lower surface of the passivation structure 90 has at least two first regions c corresponding to the device regions A of the substrate 82, at least one second region D corresponding to the segmented region B of the substrate 82, and a plurality of ditches 92 positioned within each first region C of the passivation structure 90. Furthermore, a sealing material 94 is positioned on a spot glue region of the substrate 82 and outside each active region for binding the substrate 82 and the passivation structure 90 together. The ditches 92 are used to prevent the sealing material 94 from overflowing into the segmented region B and each active region of the substrate 82 and affecting normal operation of each OLED. As mentioned above, ditches 91 similar to the ditches 92 can be positioned within the substrate 82 or the transparent conductive layer 84 between then spot glue region and the predetermined region, and an excess sealing material 96 can flow into the ditches 92 of the substrate 82 or the transparent conductive layer 84 prevent the organic layer 86 from contacting with the excess sealing material 96. In addition, a depth of each ditch 91 of the substrate 82 or the transparent conductive layer 84 is less than half of a thickness of the substrate 82 or the transparent conductive layer 84.

In the preferred embodiment of the present invention, the depth of each ditch 92 is less than half of the thickness of the passivation structure 90 to prevent from affecting the mechanism strength of the passivation structure 90. In addition, a width of the segmented region B is larger than twice a width of each ditch 92 to benefit the cutting process of the organic light emitting device 80. Moreover, a passive matrix OLED (PMOLED) is utilized as an example in the present invention, but the present invention is not limited in this. The passivation structure having the ditches of the present invention can be applied in various types of devices that need to be encapsulated and are sensitive to moisture, such as an active matrix OLED (AMOLED) and the TOLED.

In comparison with the conventional OLED, the OLED of the present invention has a plurality of ditches positioned within the passivation structure. Therefore, the excess sealing material will flow into the ditches to prevent the organic layer from contacting with the excess sealing material and affecting the normal operation of the OLED. As a result, the substrate and the passivation structure can be bound together perfectly, and the OLED of the present invention has a better airtightness. In addition, the surface of the passivation structure that faces the substrate is a smooth surface, not a rough surface. If a glass container or a transparent glass substrate is utilized as the passivation structure of the present invention, the transparent OLED of the present invention can be applied in the top emission or a double-faced emission OLED display.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An organic light emitting diode (OLED) comprising:
   a bottom substrate comprising a bottom electrode positioned on an upper surface of the bottom substrate, an organic layer positioned on the bottom electrode, a top electrode positioned on the organic layer, and a spot glue region positioned on the bottom substrate and outside the organic layer, an upper surface of the bottom electrode comprising at least one first ditch;
   a top substrate positioned parallel with the bottom substrate, and a lower surface of the top substrate comprising at least one second ditch formed within the top substrate; and
   a sealing material positioned on the spot glue region of the bottom substrate for binding the top substrate and the bottom substrate together;
   wherein the first ditch and the second ditch are used to prevent the sealing material from overflowing into the region occupied by the organic layer and affecting normal operation of the OLED.

2. The OLED of claim 1 wherein the bottom substrate comprises a glass substrate, a plastic substrate, or a metal substrate.

3. The OLED of claim 1 wherein the top substrate comprises a glass substrate, a glass container, or a metal container.

4. The OLED of claim 1 wherein the bottom electrode comprises indium tin oxide (ITO) or indium, zinc oxide (IZO), and functions as a anode of the OLED.

5. The OLED of claim 1 wherein the top electrode comprises magnesium (Mg), aluminum (Al), lithium (Li) or an alloy of Mg, Al, and Li, and functions as an cathode of the OLED.

6. The OLED of claim 1 wherein the organic layer further comprises a hole transport layer (HTL) positioned on the bottom electrode, an emitting layer (EML) positioned on the HTL, and an electron transport layer (ETL) positioned on the EML.

7. The OLED of claim 6 further comprising a hole injection layer (HIL) positioned between the bottom electrode and the HTL.

8. The OLED of claim 6 further comprising an electron injection layer (EIL) positioned between the ETL and the top electrode.

9. The OLED of claim 1 wherein the sealing material is composed of epoxy.

10. The OLED of claim 1 wherein the second ditch is positioned within the top substrate corresponding to the bottom substrate and between the spot glue region and the region occupied by the organic layer, and a depth of the second ditch is less than half of a thickness of the top substrate.

11. The OLED of claim 1 wherein the first ditch is positioned between the spot glue region and the region occupied by the organic layer, and a depth of the first ditch is less than a thickness of the bottom electrode.

12. The OLED of claim 1 further comprising a desiccating agent positioned in the OLED to prevent the organic layer of the OLED from moistening.

13. An organic light emitting device that comprises at least two organic light emitting diodes (OLEDs), the organic light emitting device comprising:
    a bottom substrate comprising it least two device regions, and a segmented region between two adjacent device regions positioned on an upper surface of the bottom substrate, each device region comprising a bottom electrode positioned on the device region, an organic layer positioned on an active region of the device region, and a top electrode positioned on the organic layer;
    a top substrate positioned parallel with the bottom substrate, a lower surface of the top substrate comprising at least two first regions corresponding to the device regions of the bottom substrate, at least one second region corresponding to the segmented region of the bottom substrate, and a plurality of first ditches positioned within each first region of the top substrate; and
    a sealing material positioned on a spot glue region of the bottom substrate and outside each active region for binding the top substrate and the bottom substrate together;
    wherein the first ditches are used to prevent the sealing material from overflowing into the segmented region and each active region of the bottom substrate and affecting normal operation of each OLED.

14. The organic light emitting device of claim 13 wherein the bottom substrate comprises a glass substrate, a plastic substrate, or a metal substrate.

15. The organic light emitting device of claim 13 wherein the top substrate comprises a glass substrate, a glass container, or a metal container.

16. The organic light emitting device of claim 13 wherein the bottom electrode comprises indium tin oxide (ITO) and indium zinc oxide (IZO), and functions as a anode of each OLED.

17. The organic light emitting device of claim 13 wherein the top electrode comprises magnesium (Mg), aluminum (Al), lithium (Li), and an alloy of Mg, Al, and Li, and functions as an cathode of each OLED.

18. The organic light emitting device of claim 13 wherein the organic layer further comprises a hole transport layer (HTL) positioned on the bottom electrode, an emitting layer (EML) positioned on the HTL, and an electron transport layer (ETL) positioned on the EML.

19. The organic light emitting device of claim 18 further comprising a hole injection layer (HIL) positioned between the bottom electrode and the HTL.

20. The organic light emitting device of claim 18 further comprising an electron injection layer (EIL) positioned between the ETL and the top electrode.

21. The organic light emitting device of claim 13 wherein the sealing material is composed of epoxy.

22. The organic light emitting device of claim 13 wherein the first ditches are positioned within the top substrate corresponding to the bottom substrate and between the spot glue region and the active region, and a depth of each first ditch is less than half of a thickness of the top substrate.

23. The organic light emitting device of claim 13 wherein the organic light emitting device further comprises at least one second ditch positioned within the bottom electrode and between the spot glue region and the active region, and a depth of the second ditch is less than a thickness of the bottom electrode.

24. The organic light emitting device of claim 13 wherein a width of the segmented region is larger than twice a width of each first ditch.

25. The organic light emitting device of claim 13 further comprising a desiccating agent positioned in each OLED to prevent the organic layer of each OLED from moistening.

26. An organic light emitting device that comprises at least two organic light emitting diodes, the organic light emitting device comprising:
    a bottom substrate comprising at least two device regions, and a segmented region between two adjacent device regions positioned on an upper surface of the bottom substrate, each device region comprising a bottom electrode positioned on the device region, an organic layer positioned on an active region of the device region, and a top electrode positioned on the organic layer;
    a top substrate positioned parallel with the bottom substrate, a lower surface of the top substrata comprising at least two first regions corresponding to the device regions of the bottom substrate, at least one second region corresponding to the segmented region of the bottom substrate, and a plurality of first ditches positioned within each first region of the top substrate, a width of each first ditch being less than half a width of the segmented region; and
    a sealing material positioned on a spot glue region of the bottom substrate and outside each active region for binding the top substrate and the bottom substrate together;
    wherein the first ditches are used to prevent the sealing material from overflowing into the segmented region and each active region of the bottom substrate and affecting normal operation of each OLED.

* * * * *